United States Patent [19]

Ugro, Jr.

[11] 3,956,528

[45] May 11, 1976

[54] SELECTIVE PLATING BY GALVANIC ACTION

[75] Inventor: Josef V. Ugro, Jr., Mahtomedi, Minn.

[73] Assignee: Minnesota Mining and Manufacturing Company, St. Paul, Minn.

[22] Filed: Nov. 15, 1974

[21] Appl. No.: 524,046

[52] U.S. Cl. .............................. 427/125; 427/96; 427/123; 427/426; 427/427
[51] Int. Cl.² ...................... B05D 5/12; B05D 1/34; B05D 1/36; B05D 1/02
[58] Field of Search ............ 427/123, 125, 426, 427

[56] References Cited
UNITED STATES PATENTS

| | | | |
|---|---|---|---|
| 2,564,706 | 8/1951 | Mochel .......................... | 427/126 X |
| 2,664,363 | 12/1953 | Meth .............................. | 427/168 |
| 2,748,023 | 5/1956 | Meth .............................. | 427/168 |
| 2,759,845 | 8/1956 | Hilemn .......................... | 427/168 X |
| 2,915,414 | 12/1959 | Hilemn .......................... | 427/168 |
| 2,996,406 | 8/1961 | Weinrich ........................ | 427/168 |
| 3,084,063 | 4/1963 | Barnes et al. ................. | 427/427 |
| 3,372,059 | 3/1968 | Roth .............................. | 427/123 |
| 3,650,708 | 3/1972 | Gallagher ...................... | 427/123 |
| 3,764,488 | 10/1973 | Bernhardt ..................... | 427/125 X |
| 3,772,078 | 11/1973 | Polichette et al. ............ | 427/123 X |

Primary Examiner—Harry J. Gwinnell
Assistant Examiner—Shrive P. Beck
Attorney, Agent, or Firm—Alexander, Sell, Steldt & DeLaHunt

[57] ABSTRACT

A conductive substrate, particularly a pattern attached to or embedded in an insulating medium and involving nonintegral elements, is galvanically plated by contacting an exposed electrically conductive substrate (preferably in the form of a pattern) with a spray comprising the dissolved salt of a plating metal together with a powdered driving metal which is less noble than either the substrate or the plating metal, said driving metal being mixed with an inert, sprayable, particulate material, thereby resulting in the deposition of said plating metal on said conductive substrate.

13 Claims, 2 Drawing Figures

27
SELECTIVE PLATING BY GALVANIC ACTION

FIELD OF THE INVENTION

This invention relates to the metal plating of conductive substrates. In another aspect, the invention relates to a new and useful means for metal plating conductive substrates which are nonintegral in nature.

DESCRIPTION OF THE PRIOR ART

It is common practice to plate conductive materials, especially on nonconductive substrates, to form printed circuits, or to plate conductive or noble materials on a substrate to provide decorative or protective coatings. Four major techniques are known for providing metal coatings on conductive nonintegral patterns: displacement plating, electroplating, autocatalytic chemical plating and mechanical plating.

The practice of this invention relates to the principles of contact plating by chemical means originally observed by Bessemer in 1831. A number of patents disclose the use of a merged spray technique for plating. Two sprays are sprayed on a surface to be plated, the sprays merging near or at the surface to be plated. The first spray comprises a dispersed particulate driving metal powder and the second spray comprises a solution containing ions of the metal to be plated. Disclosures of this technique are particularly numerous in the field of producing silver coatings or protective coatings on mirrors where only thin film plating is required to provide a useful product and therefore plating time is not a problem, (e.g., see U.S. Pat. Nos. 2,664,363; 2,748,023; 3,084,063).

The prior art plating techniques have one or more disadvantages when used to plate a nonintegral conductive pattern with a thick film, particularly if a rounded cross section is necessary on all of the conducting elements. Using the prior art disclosures, thick films are not obtainable by displacement plating techniques, such techniques being limited to very thin films, and the use of autocatalytic chemical plating is prohibitively slow to plate a thick deposit of the plating material on a conductive pattern.

Previously, the only practical way to achieve a heavy deposition of plated material was by means of electroplating. Electroplating requires every element of the substrate being plated to be connected to an externally applied d.c. voltage. This results in a complicated electrical circuit when plating conductive patterns having many nonintegral parts.

This invention combines the convenience and economic advantages of simple displacement plating techniques with the rapid metal deposition of standard electroplating. This invention also gives thin lines having a rounded cross section as opposed to the undesirable mushroom shaped cross section formed by electroplating thin lines.

SUMMARY OF THE INVENTION

Briefly, it has been found that adding an inert particulate material, such as glass beads, to the driving metal powder of a spray galvanic system unexpectedly increases the rate of metal deposition. The present invention solves problems inherent in the prior art and provides a simple rapid way to provide a metallic plating on conductive surfaces, particularly patterns which are attached to or embedded in an insulating medium or those conductive patterns which involve nonintegral conductive patterns. The present invention also provides a plating system which is more convenient and cheaper than electroplating, provides thicker films than those available using displacement plating and preserves the simplicity of mechanical plating. An initial conductive pattern necessary for the practice of this invention can be formed by a variety of well-known means and can be composed of a wide variety of conductive materials. This technique does not require electrical connections to all the elements of the pattern and it is capable of depositing a thick, adherent, uniform metallic coating at high deposition rates, on lines of varying widths. Some of the uses for this invention would include preparation of printed circuits, protective coatings for patterns (e.g., printing plates), deposition of resistance elements and the formation of strippable patterns.

BRIEF DESCRIPTION OF THE DRAWING

A further understanding may be had by referring to the accompanying drawing in which.

DETAILED DESCRIPTION

Figure 1:
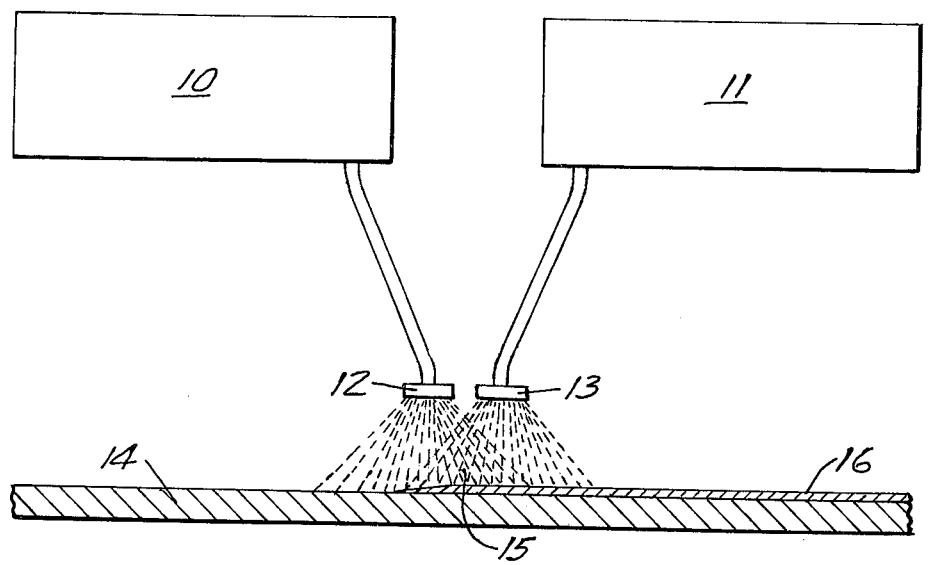
FIG. 1 is a side elevation in partial section of the application of this invention in the merged spray plating of a conductive substrate.

Referring to the accompanying drawing and initially to FIG. 1, a plating solution supplied from reservoir 10 comprising ions of the plating metal to be deposited, and a mixture supplied from reservoir 11 comprising the driving metal and an inert particulate material are sprayed via nozzles 12 and 13 onto a conductive pattern 14 in the form of a merged spray 15. A layer of metal 16 is formed as the driving metal reacts galvanically with the ions of the plating metal on the conductive substrate material 14.

Figure 2:
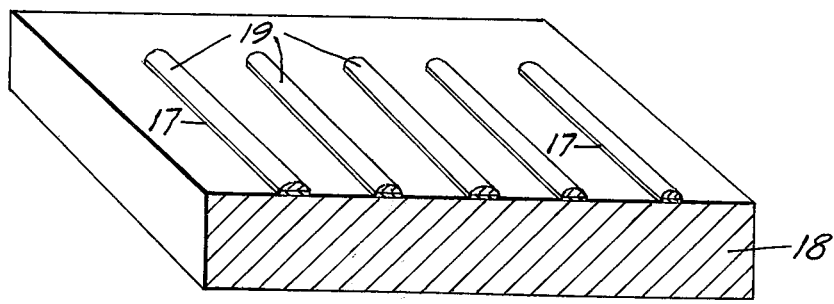
FIG. 2 is a projection in section of a conductive substrate plate in accordance with this invention.

The technique of FIG. 1 is useful in plating shaped conductive substrates such as the one represented in FIG. 2. A shaped conductive substrate 17 comprising a conductive material has been disposed on an insulating base substrate 18. Plating using the technique of this invention provides a layer of plated metal 19 having a rounded cross section.

The technique for plating using this invention comprises spraying a conductive pattern, which can be disposed on an insulating substrate, with a plating solution comprising ions of the metal or metals to be plated, and a mixture of particulate driving metal powder mixed with a solid particulate medium which is inert to the metals and solvent present, said inert medium having a particulate size of 5–500 microns. The inert medium used is smaller than that commonly used in mechanical plating. Deposition of the desired metal occurs on the conductive pattern by galvanic action between the metallic ions and the more electro-positive driving metal on the conductive pattern material.

Admixing the driving metal powder with an inert medium, (e.g., glass beads), is not detrimental to the plating action notwithstanding that an additional non-reactive element has been added to the plating mixture. The mixing of the particulate driving metal powder with an inert material increases the rate of metal deposition from the plating solution by up to ten or more times the normal rate of plating from a similar plating solution without the inert particulate material.

The spraying process of this invention can be operated in a number of different ways, among which are: (1) formation of an essentially homogeneous dispersion of the driving metal-inert medium mixture in the plating metal solution followed by spraying the resulting admixture onto the pattern; and (2) merging the spray of the plating metal solution with a spray of the driving metal-inert medium mixture. The driving metal spray can comprise a dispersion of the particles in a carrier liquid or a dispersion of the particles in a carrier gas. Merging of the plating solution spray and driving metal-inert medium spray can occur before or upon contact with the pattern. To achieve the desired uniformity of deposition, it is important that substantially every portion of the element to be plated be subjected to substantially the same number of contacts of driving metal particles per unit time per unit area.

The particulate driving metal is selected from the more easily oxidized metals and alloys; among such metals are magnesium, aluminum, zinc, tin, cadmium, iron and alloys such as the magnesium aluminum alloys. The preferred driving metal is zinc by reason of having freedom from formation of oxide layers and having a greater efficiency of utilization of driving metal for plating on the conductive substrate than does other metals. In all cases, the driving metal powder chosen must have a more positive oxidation potential in the plating solution used than the metal or metal alloy ions which are to deposited on the conducting elements. The particle size of the driving metal may be from about 1 to about 100 microns and preferably from about 5 to 50 microns. For driving particles having a particle size of less than 1 micron, the displacement reaction proceeds so fast that the short residence time of the driving metal on the conductive substrate produces a slow plating rate. For driving metal particle sizes greater than about 100 microns, the amount of driving metal required to obtain uniform coatings of plating metal becomes large and the system becomes impractical. Particles with diameters in the 5 to 50 micron range provide a good metal deposition rate with moderate amounts of driving material and thus form the preferred systems. By displacement reaction is meant the reactions that may be typically expressed as $Zn^\circ + CuSO_4 \rightarrow Cu^\circ + ZnSO_4$ and $Zn^\circ + 2H^+ \rightarrow H_2 + Zn^{+2}$ which takes place while the driving metal is not in contact with the conductive substrate.

The inert medium to be mixed with the particulate metal can be any particulate material which is chemically inert to the solutions used for plating the driving metals and the conductive substrate. The inert medium can have a particle size in the range of 5–500 microns, preferably 50–100 microns in diameter. The inert media can be chosen from a number of materials, e.g., silicon carbide, silica, (e.g., sand), ceramic powders, refractory powders, glass beads and other inorganic particles. The particles may have a smooth surface or may have an irregular surface such as that obtained by fracturing larger particles.

The plating metal to be deposited on the conductive pattern must be more noble, that is, less positive in oxidation potential in the plating solution than the driving particulate material chosen and must be capable of being deposited on the conductive element when in contact with the plating solution used. Representative metals are copper, silver, gold and nickel. Other metals which can be expected to perform well are those metals which perform well in known electroplating techniques, (e.g., cobalt, nickel-cobalt alloys, lead, tin, mercury, thallium, indium and cadmium).

The plating metal can be deposited on the conductive pattern only when ions of the plating metal and particles of the driving metal are in contact with a conductive surface, allowing the reduction of the plating metal from ionic to metallic form and a consequent oxidation of the driving metal to an ionic form. A greater number of contacts will result in a greater number of plating ions being deposited as a metallic film. The function of the inert media appears to be as an aid to the maintenance of positive contact between the driving particulate metal powder and the conductive pattern elements. Unlike the driving media used in mechanical plating, the inert driving media of this invention is very small in size and does not contribute to a mechanical plating of the conductive surfaces by mechanical hammering and cold welding. It has been found that in the presence of the inert medium, there are dramatic increases in the rate of deposition and a resulting smoothness of the deposited material.

The material which forms the elements of the conductive substrate must be capable of serving as a cathode when in contact with the driving metal. For practical purposes, the pattern elements must contain either significant proportions of graphitic carbon, a metal having a lower oxidation potential than the driving metal, certain conductive metal oxides such as $SnO_2$, or a metal which will initially plate a thin adherent layer of the desired metal ion by means of displacement plating, said desired metal providing a conductive substrate for further spray-galvanic deposition.

Many methods for forming and attaching an initial conductive substrate on an insulating substrate are well known in the art. Acceptable materials for forming a conductive substrate include conductive carbon inks, metal-filled inks, pencil marks, vapor deposited patterns of conductive materials, and copper or nickel deposits formed by electroless chemical plating.

The invention is further understood by refering to the following illustrative examples in which all parts are by weight unless otherwise specified.

EXAMPLE 1

A vapor-coated printed circuit of copper was formed on a polyimide ("Kapton", available from E. I. DuPont) substrate.

An aqueous plating metal solution was formed using 50 grams per liter of $CuSO_4.5H_2O$ and 20 grams per liter of concentrated sulfuric acid. Zinc dust powder of approximately 8 micron size (pigment grade zinc, available from New Jersey Zinc Co.), and glass beads having a diameter of approximately 50 microns ("Scotchbrite" 50–500S available from 3M Company), were mixed in a ratio of 50 parts by volume of glass beads to one part by volume of zinc powder to form a driving metal-inert medium mixture.

The conductive copper substrate was sprayed using modified Binks flocking guns 171 and Binks spray heads No. 26. The plating solution and metal-bead mixture were sprayed as merged sprays impinging on the copper substrate. The spraying was continued for 15 minutes and an average thickness increase of 0.9 mils of copper on the conductive pattern resulted.

There was no detectible deposition of copper on the polymide substrate.

Photomicrographs of the cross section of the plated pattern showed a uniform build up of copper and conductive elements having a rounded cross section similar to that shown in FIG. 2.

EXAMPLE 2

The plating technique of Example 1 was repeated using a conductive substrate formed by drawing a pattern on a porous ceramic substrate with a soft-number two lead pencil. The spraying was conducted for approximately three minutes. After spraying, examination of the conductive substrate showed a thin copper layer on the conductive pattern.

EXAMPLE 3

The experiment of Example 1 was repeated using a conductive substrate formed of $SnO_2$ on an $Al_2O_3$ substrate using the techniques disclosed in U.S. Pat. No. 2,564,706.

A smooth film (approximately 2 microns thick) of copper was deposited on the treated surface in a spraying time of approximately five minutes. Examples 3 and 4 show that various substrates and conductive patterns can be used.

EXAMPLE 4

An aqueous plating metal alloy solution was formed comprising 3.6 grams per liter $Pb(BF_4)_2$, 12 grams per liter $SN(BF_4)_2$ and 15 grams per liter $HBF_4$. A mixture of glass beads and zinc powder in a ratio of 100:1 by volume was also formed.

A copper foil surface was sprayed using a technique similar to Example 1.

An adherent, gray deposit having the alloy composition 76.3 percent Sn and 23.7 percent Pb was formed on the copper foil showing alloy deposition is possible using the technique of this invention.

EXAMPLE 5

A series of runs were made using the technique of Example 1, where the driving metal mixture was glass beads-powdered metal in a 100:1 ratio by weight. Satisfactory coatings were obtained at a deposition rate of 2 mil/hour. A maximum coating rate of 5.8 mils per hour could be obtained, the coatings at this rate, however, being considerably rougher. When the inert beads were omitted, the corresponding rates were 0.25 mil/hour and 0.41 mil/hour respectively.

EXAMPLE 6

The experiment of Example 1 was repeated using iron powders of approximately 20 micron size in place of zinc dust as the driving metal. A similar deposition of copper on the conductive pattern was obtained.

EXAMPLE 7

The experiment of Example 1 was repeated using inert silicon carbide particles that pass through a U.S. standard sieve having 240 mesh/inch. There was deposited 0.6 mil of copper per hour. Similar results were obtained when 320 mesh silicon carbide was used.

Various modifications and alterations of this invention will become apparent to those skilled in the art without departing from the scope or spirit of this invention, and it should be understood that this invention is not to be limited to the illustrative embodiments set forth herein.

What is claimed is:

1. A method for depositing metal on a conductive substrate by galvanic action, comprising the steps of:
    spraying the conductive substrate with a first spray of a liquid solution containing ions of the plating metal to be plated onto the conductive substrate; and
    spraying the conductive substrate with a second spray comprising a mixture of (1) particulate driving metal having a particle size of about 1–100 microns and being less noble than said plating metal, and (2) an inert particular material having a particle size of about 5–500 microns, while allowing the two sprays to mingle on the conductive substrate and deposit a layer of said plating metal on the conductive substrate.

2. The method according to claim 1 where said driving metal is zinc.

3. The method according to claim 1 where said driving metal is iron.

4. The method according to claim 1 where said inert particulate material is silicon carbide.

5. The method according to claim 1 where said metal to be plated is selected from copper, silver, gold, nickel, cobalt, tin and lead.

6. The method according to claim 1 where said metal to be plated is copper.

7. The method according to claim 1 where said conductive substrate contains at least 5 percent by volume of conductive carbon.

8. The method according to claim 1 where said conductive substrate is comprised of nonintegral conductive elements on an insulating substrate.

9. The method according to claim 1 where said sprays are applied to said conductive substrate simultaneouly as a merged spray.

10. The method of claim 1 where said inert particulate material is glass beads.

11. A method for depositing copper on nonintegral conductive elements of copper on an insulating substrate by galvanic action, comprising merging the spray of a liquid comprising copper sulfate with a spray comprising a mixture of particulate zinc having a particle size of 1 to 100 microns and inert glass beads having a size of 5 to 500 microns, and applying the resulting merged spray to said conductive elements to deposit a layer of copper thereon.

12. A method for depositing metal on a conductive substrate by galvanic action, comprising spraying said conductive substrate with a solution containing ions of the plating metal to be plated on said conductive substrate, particulate driving metal having a particle size of 1 to 100 microns, and inert particulate material having a particle size of 5 to 500 microns, said driving metal being less noble than said plating metal, to deposit a layer of said plating metal on said conductive substrate.

13. The metal according to claim 12, wherein said plating metal and conductive substrate are copper, said driving metal is zinc, and said inert particulate material is glass beads.

* * * * *

UNITED STATES PATENT OFFICE
CERTIFICATE OF CORRECTION

PATENT NO. : 3,956,528
DATED : May 11, 1976
INVENTOR(S) : Josef V. Ugro, Jr.

It is certified that error appears in the above-identified patent and that said Letters Patent are hereby corrected as shown below:

Column 5, line 31, "$SN(BF_4)_2$" should read -- $Sn(BF_4)_2$ --.

Signed and Sealed this

Twenty-ninth Day of March 1977

[SEAL]

Attest:

RUTH C. MASON
Attesting Officer

C. MARSHALL DANN
Commissioner of Patents and Trademarks